(12) United States Patent
Howerton et al.

(10) Patent No.: US 7,437,207 B2
(45) Date of Patent: Oct. 14, 2008

(54) METHOD AND APPARATUS FOR AUTOMATICALLY PROCESSING MULTIPLE APPLICATIONS IN A PREDETERMINED ORDER TO AFFECT MULTI-APPLICATION SEQUENCING

(75) Inventors: Jeffrey Howerton, Portland, OR (US); Mehmet Alpay, Portland, OR (US); Ling Wen, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 11/754,254

(22) Filed: May 25, 2007

(65) Prior Publication Data

US 2007/0278191 A1 Dec. 6, 2007

Related U.S. Application Data

(60) Provisional application No. 60/810,480, filed on Jun. 3, 2006.

(51) Int. Cl.
G06F 19/00 (2006.01)
G05B 19/18 (2006.01)
B41F 21/12 (2006.01)
B41F 21/14 (2006.01)
H01L 23/544 (2006.01)
G06K 9/00 (2006.01)
G06K 9/36 (2006.01)

(52) U.S. Cl. .......................... 700/125; 700/58; 700/59; 700/121; 101/481; 101/485; 257/797; 382/151; 382/287; 438/401; 438/462

(58) Field of Classification Search .................. 700/57, 700/58, 59, 60, 121, 124, 125, 192; 83/33; 101/481, 485; 257/797; 348/94, 95, 189, 348/190; 356/485, 490, 508; 382/151, 184, 382/287, 294; 438/401, 462, 975
See application file for complete search history.

(56) References Cited

U.S. PATENT DOCUMENTS

| 5,132,195 | A | * | 7/1992 | Pool | 430/22 |
| 6,463,426 | B1 | * | 10/2002 | Lipson et al. | 707/3 |
| 6,532,054 | B2 | * | 3/2003 | Ohmuro et al. | 349/143 |
| 6,804,388 | B2 | * | 10/2004 | Vernackt | 382/151 |
| 7,115,513 | B2 | * | 10/2006 | Chiang et al. | 438/689 |
| 2007/0269959 | A1 | * | 11/2007 | Freeman et al. | 438/455 |

* cited by examiner

Primary Examiner—Crystal Barnes Bullock
(74) Attorney, Agent, or Firm—Young Basile

(57) ABSTRACT

An apparatus and method performing a sequence of processing steps on a load supported by a processing plate. The load can include a single sheet on which a plurality of applications are performed or can include a plurality of panels on which respective applications are performed. For each application, at least one coarse target and at least one panel target are used to adjust the programmed coordinates for that application. After the first application of the load is processed using the coarse and panel targets, coarse and panel targets are located for the second application. Using the alignment provided by these targets, the second application is processed. Each subsequent application is similarly aligned and processed.

18 Claims, 6 Drawing Sheets

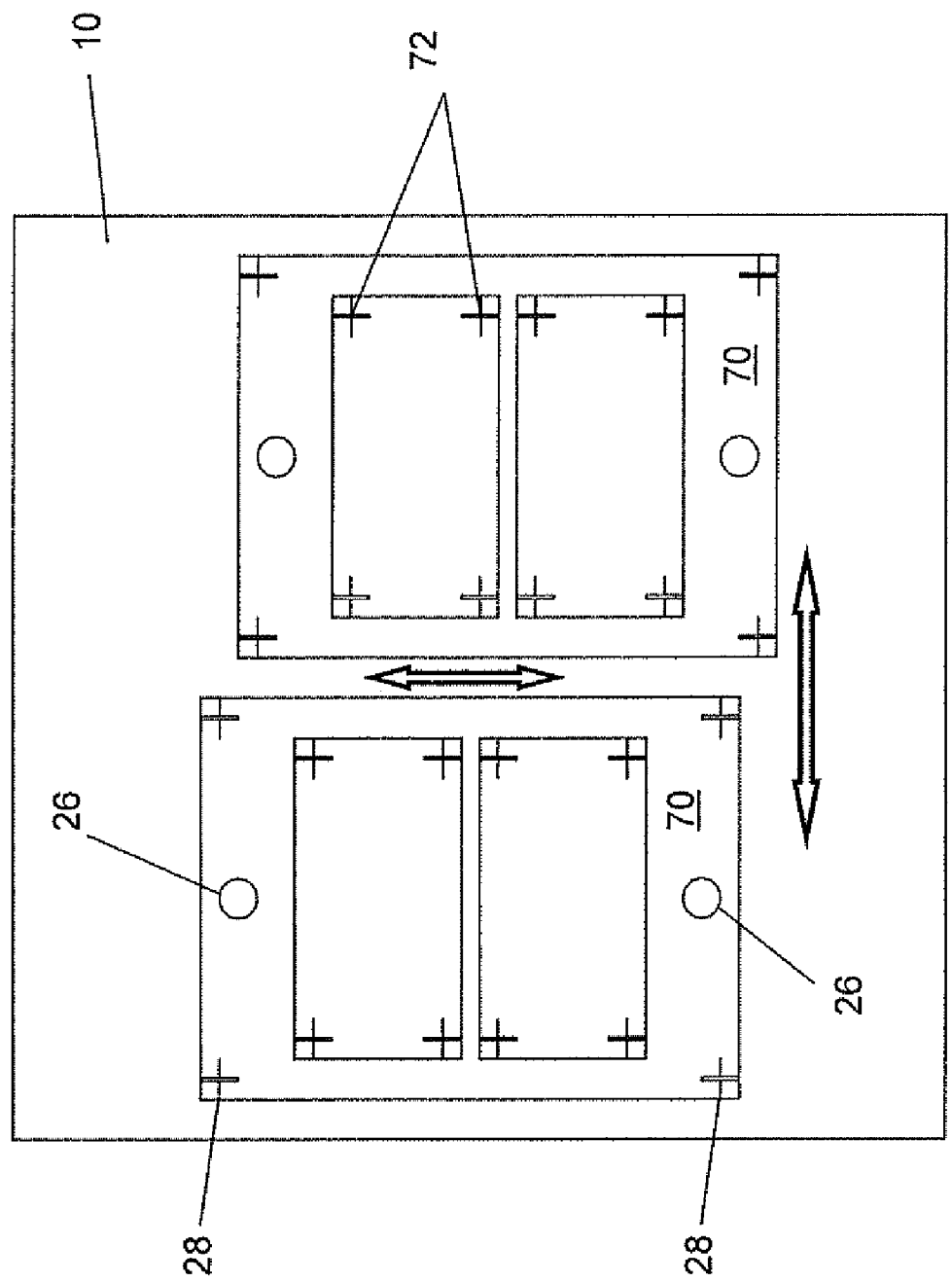

METHOD AND APPARATUS FOR AUTOMATICALLY PROCESSING MULTIPLE APPLICATIONS IN A PREDETERMINED ORDER TO AFFECT MULTI-APPLICATION SEQUENCING

DESCRIPTION OF RELATED APPLICATION

This application claims priority of Provisional Patent Application Ser. No. 60/810,480, filed on Jun. 3, 2006, which is incorporated by reference herein in its entirety.

FIELD OF THE INVENTION

The invention relates, in general, to a method and apparatus for sequencing applications, such as those associated with drilling, on multiple parts in a single processing cycle.

BACKGROUND

In printed circuit boards and other functionally similar structures such as flexible circuit boards, the surfaces are processed in various ways, such as by punching holes therethrough. Current laser drilling technologies and new applications result in tighter tolerances than those possible from conventional methodologies.

BRIEF SUMMARY

Methods of performing a sequence of processing steps on a load supported by a processing plate are taught herein. One such method comprises creating a sequential list of at least two applications to be performed in separate regions of the load, each of the at least two applications including respective processing steps; locating a coarse target of a first region of the load, the coarse target associated with a first application; comparing predetermined coordinates for the coarse target of the first region with measured coordinates for the coarse target of the first region; locating a panel target of the first region, the panel target of the first region associated with the first application; comparing predetermined coordinates for the panel target of the first region with measured coordinates for the panel target of the first region; and performing processing steps of the first application in the first region based on the results of the two comparisons. Locating a coarse target, comparing predetermined coordinates for the coarse target with the measured coordinates, locating a panel target, comparing predetermined coordinates for the panel target with the measured coordinates and performing processing steps are performed in sequence for each subsequent application.

Also disclosed are apparatuses for performing the methods taught herein. According to one example taught herein, the method includes a controller programmed to perform the method previously described. According to another example taught herein, the apparatus comprises a vacuum support, an autoloader including a loader arm for loading the processing plate on the vacuum support and an unloader arm for removing the processing plate from the vacuum support after the sequence is complete, and a controller programmed to perform the method previously described.

These embodiments and other inventive features that can be used in these embodiments and other embodiments are described hereinafter with reference to the drawing figures.

BRIEF DESCRIPTION OF THE DRAWINGS

The description herein makes reference to the accompanying drawings wherein like reference numerals refer to like parts throughout the several views, and wherein:

FIG. 6 is a simplified plan view of the chuck supporting two panels.

DETAILED DESCRIPTION OF EMBODIMENTS OF THE INVENTION

Embodiments of the invention provide the ability to process parts in a single cycle, such as a single drill cycle. Also, positional errors that occur when processing a series of parts are processed are dynamically corrected. Such positional errors are caused when, for example, one part is processed and tension is released such that the location of the next part to be processed changes. In addition, a full complement of cameras generally available in vision systems can be used on each part to be processed. Details of certain embodiments of the invention are described by reference to FIGS. 1-5.

Figure 1:
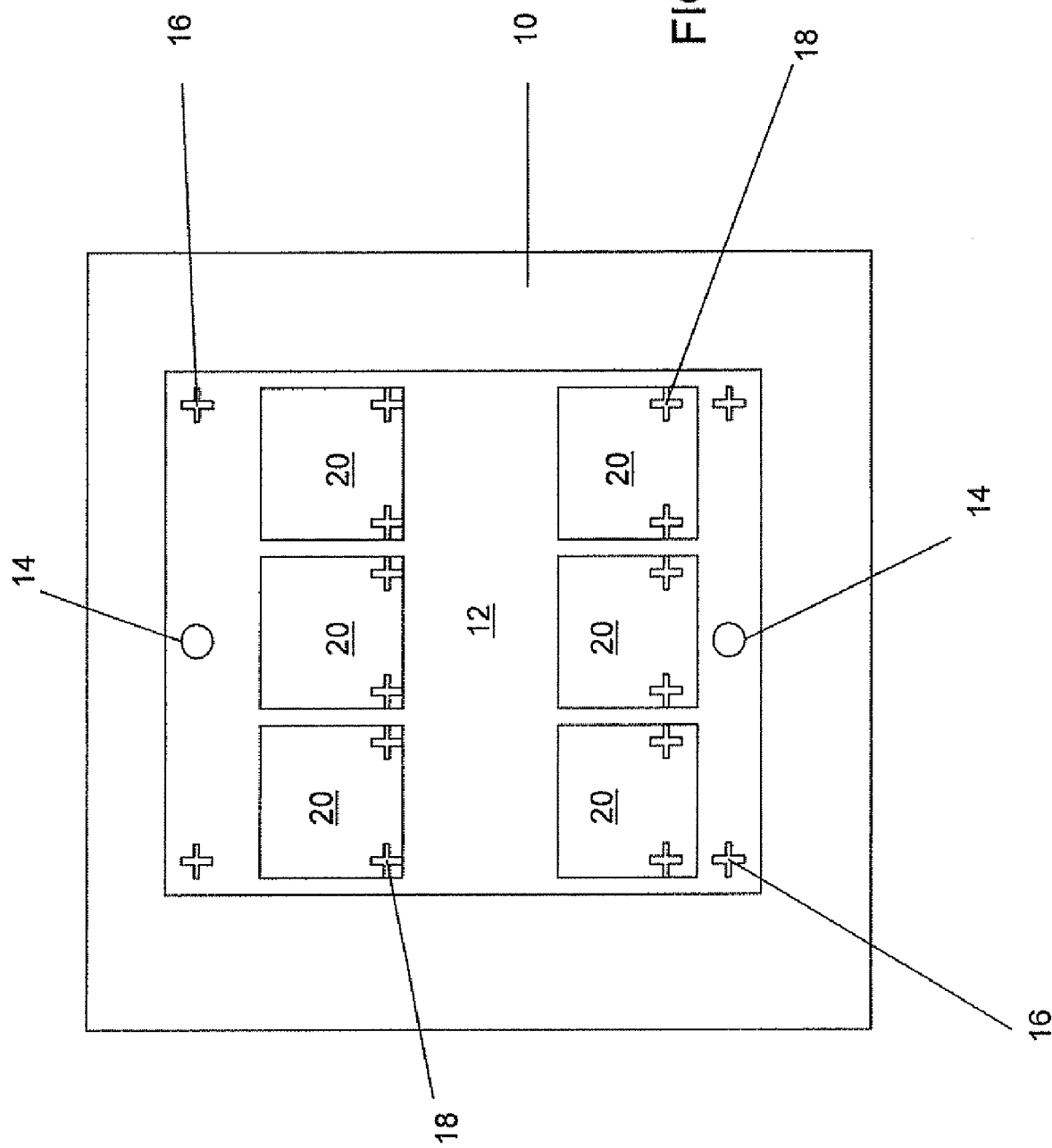
FIG. 1 is a simplified plan view of a panel supported by a chuck on which a plurality of patterns are performed.

FIG. 1 illustrates a processing plate, or chuck plate, 10 as is known in the art to support a panel 12, generally using a vacuum. The panel 12 can be, for example, a printed circuit board or the like. The panel 12 has coarse targets 14 and panel targets 16 placed thereon through known methods. The coarse targets 14 and panel targets 16 allow orientation of a process tool, such as a laser drill, with respect to the targets 14, 16 through known image processing. Also on the panel 12 are plurality of pattern targets 18, each associated with a region 20 on which a pattern is to be processed. The pattern targets 18 are also placed thereon by methods used for the placement of the targets 14, 16. By example, six regions 20 are shown for patterns 1-6, and each region 20 contains two pattern targets 50 located adjacent three of the sides of the respective region 20.

In operation, an alignment routine is performed to align the panel 20 with a pattern alignment. The ideal, preprogrammed CAD coordinates are updated based on the alignment information, and each region 20 of the panel 12 is processed without additional alignment or imaging. More specifically, the system is trained for the panel 12. Training occurs when the system is taught the locations of the coarse targets 14, the locations of the panel targets 16 and the locations of the pattern targets 18. After training, the system processes the application by performing a number of processing steps. It first locates the coarse targets 14 using a low resolution camera of the system in order to establish the spatial relationship between the coarse targets 14 and the panel 12. Coarse alignment allows for a wider field of view and allows for the correction of gross panel to panel placement error caused when a new panel is replacing a processed panel on the chuck 10. Then, the panel targets 16 are located using a high resolution camera of the system. The panel targets 16 more accurately define the metes and bounds of the panel 12 in relation to the machine coordinate frame. The ideal CAD coordinates and actual measured coordinates for the panel targets 16 are used to establish a more refined alignment mapping between the two coordinate frames, i.e., the machine coordinate frame and the panel 12. This is also called panel registration.

In succession, the pattern targets 18 that define the location for each region 20 on the panel 12 are located using the high resolution camera. The ideal CAD coordinates and the actual measured coordinates of the pattern targets 18 are then used to establish even more refined alignment mappings that can be locally applied to each individual region 20 for placement of patterns 1-6. Once all of the pattern targets 18 are located, the system processes all of the programmed patterns 1-6 simultaneously. That is, for the entire panel 12, every feature in every pattern 1-6 belonging to the same processing step are processed together.

While such a system has the ability to align to multiple patterns in various regions 20 on the panel 12, it is assumed that the pattern spacing is well-defined within the confines of the single panel 12. That is, since there is only one panel 12, any patterns to be processed, and their locations, are always referenced from a single base tool-path file in a predetermined application sequence. To process another application sequence, the panel 12 is removed from the chuck plate 10, and another panel 12 is moved into place for processing according to the predetermined application sequence or a new application sequence.

Problems arise with this method under various circumstances. First, the inventors have found that while this assumption is accurate for a rigid body, it is not accurate for panels such as flexible circuit boards. The very properties that make these boards desirable for applications make them difficult to process. That is, a panel that is not rigid can be subjected to shifting, stretching or deformation while being processed. Tight mechanical tolerances are generally required for processing such boards, and shifting, stretching or deformation can cause the pattern to be processed in an incorrect location.

Further, according to current methods, a chuck plate 10 is generally sized to support a panel with specified dimensions in order to provide rigid support. In the event that a different sized panel is to be processed, a new chuck plate 10 can be used, whether the panel is smaller or larger than the chuck plate 10. Alternatively, a jig or the like can be used to rigidly support a smaller panel within the larger chuck plate 10. Either option causes an undesirable delay in the processing of multiple panels.

Multi-application processing addresses both of these problems.

The multi-application processing can be used to break a single-panel application into multiple applications. The system aligns to each portion of the main panel that now corresponds to one of the applications in the sequence immediately prior to processing that particular portion. In this way, a predetermined application sequence can be processed sequentially in a plurality of regions on that panel.

Figure 2:
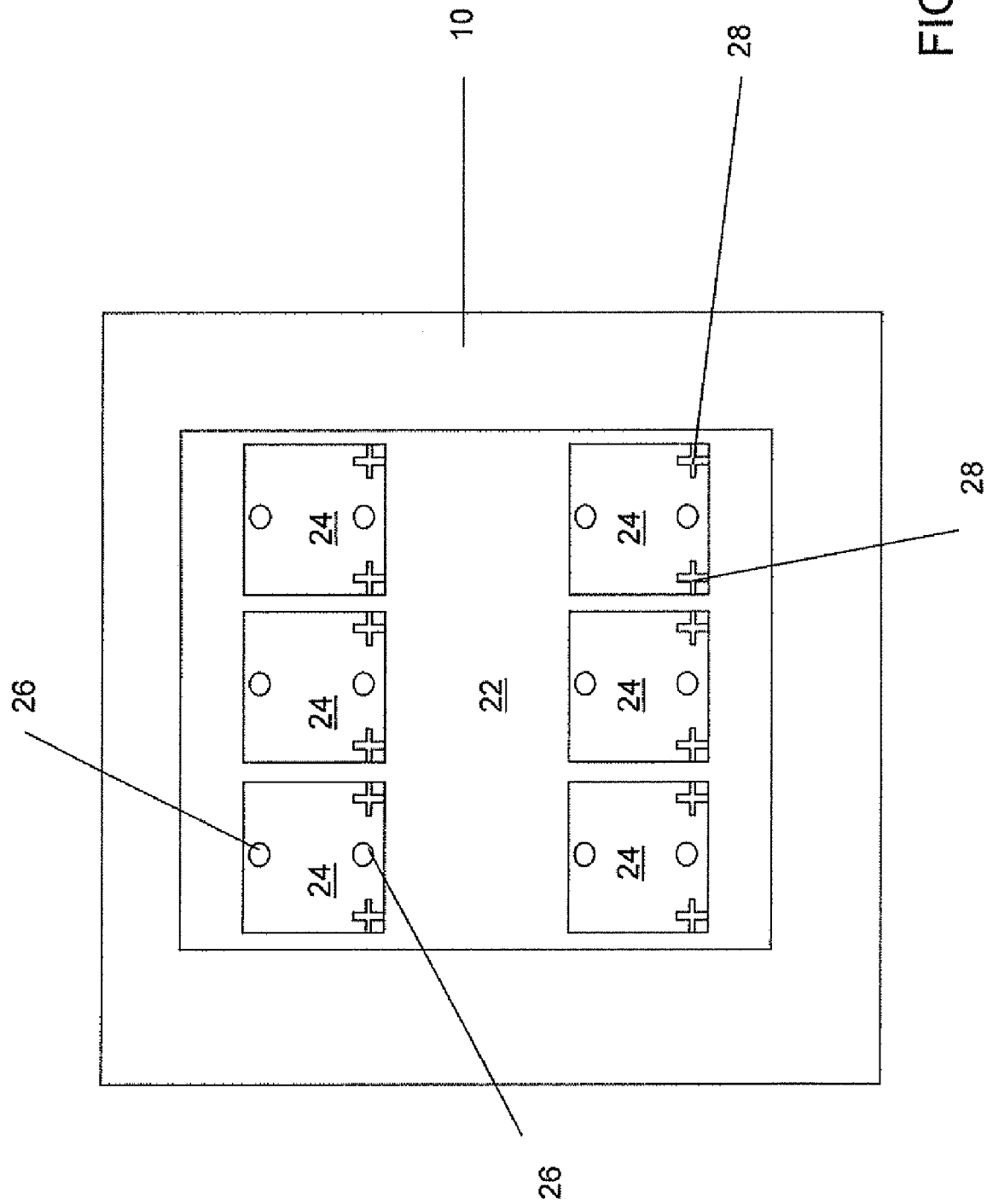
FIG. 2 is a simplified plan view of a panel supported by the chuck on which a plurality of applications are performed.

FIG. 2 illustrates the same chuck 10 as shown in FIG. 1 supporting a single panel 22 characterized by a plurality of regions 24 to be processed by respective applications according to a predetermined application sequence, and each application is generally characterized by a series of processing steps. Each of the plurality of regions 24 is identified by both coarse targets 26 and panel targets 28. In the multi-application sequencing, a list of applications is first loaded. A first application is called, and alignment targets 26, 28 for that particular application are identified. That is, the particular region 24 that is to be processed by the first application is identified. The application is performed in that regions, and then the system automatically proceeds to the next application in the application sequence that corresponds to processing another region 24 of the work surface (here, panel 22).

Figure 3:
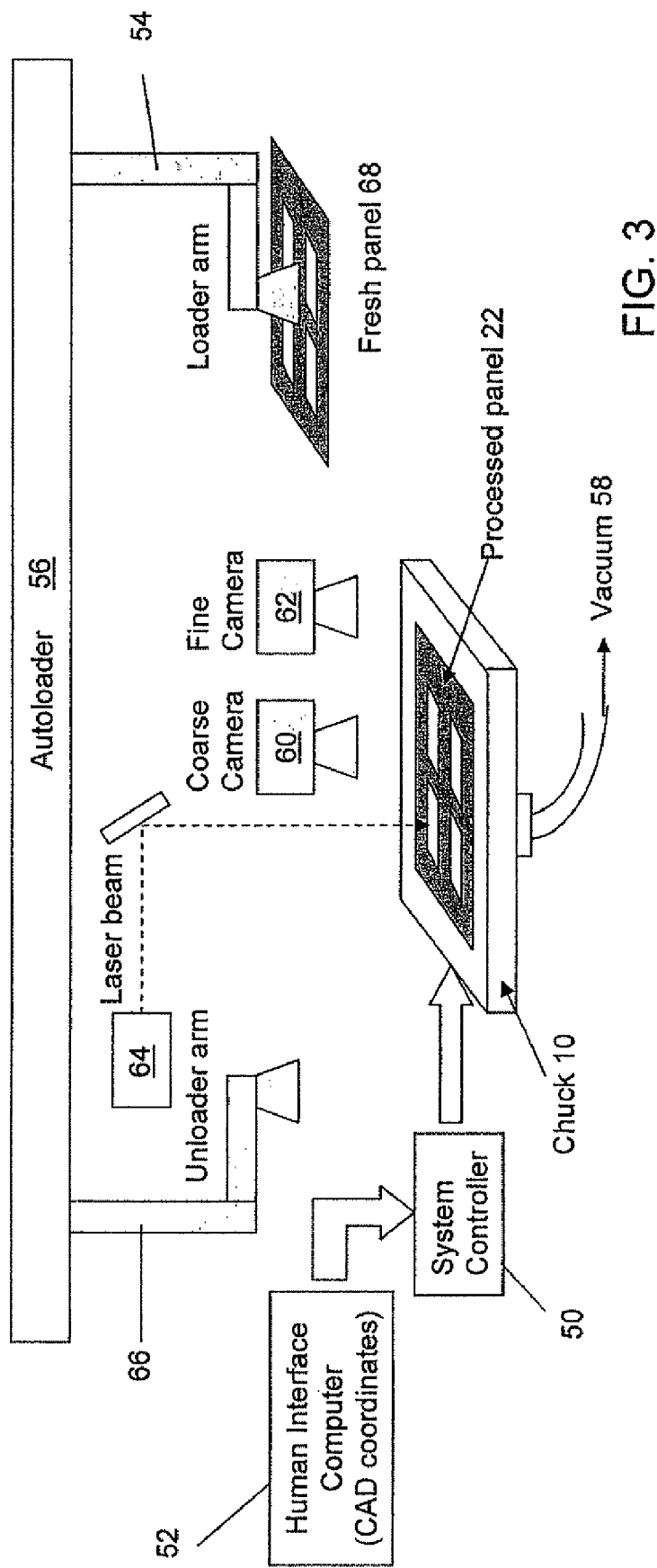
FIG. 3 is a system schematic in which the processing occurs.

The sequence of steps followed to process the sequence of applications for a panel 22 such as shown in FIG. 2 is described with reference to the system schematic of FIG. 3 and the flow charts of FIGS. 4 and 5.

Figure 4:
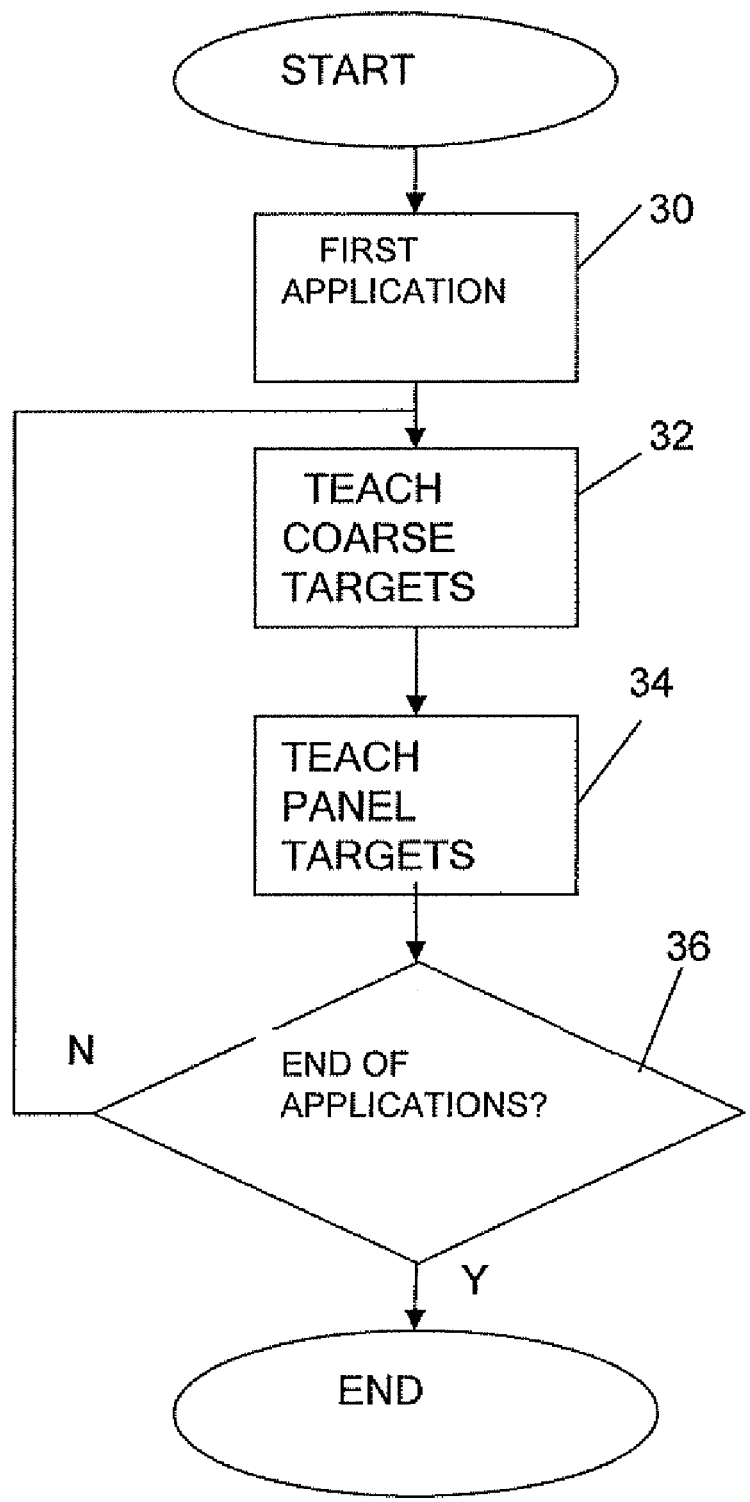
FIG. 4 is a flow chart of a training process performed prior to sequencing.
Figure 5:
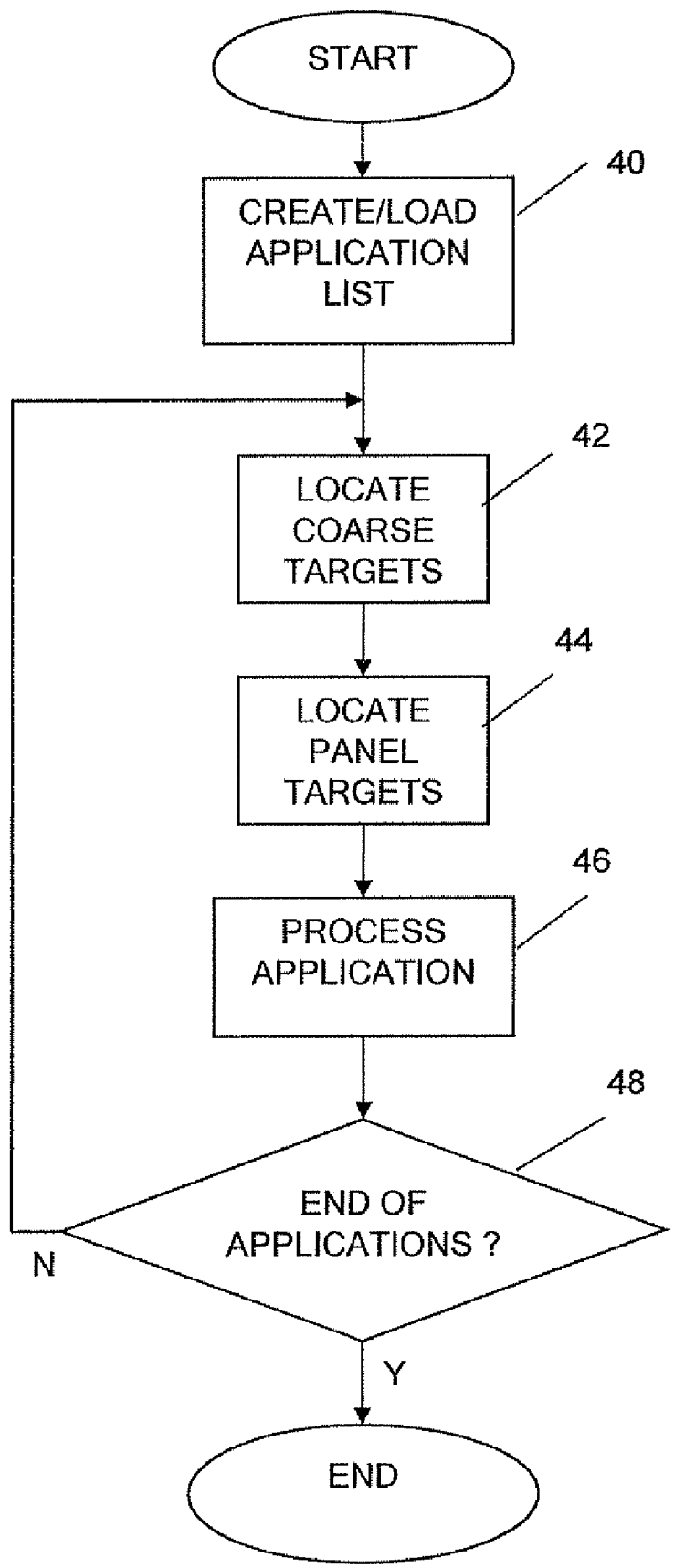
FIG. 5 is a flow chart of the sequencing after the training process is performed.

First, training can occur as shown in FIG. 4. At 30, the first application is selected. Each of the applications is stored in a computer including a system controller 50 in a sequence in which the applications are to be performed. The system controller 50 generally consists of a microcomputer including central processing unit (CPU), input and output ports (I/O) receiving data, random access memory (RAM), keep alive memory (KAM), a common data bus and read only memory (ROM) as an electronic storage medium for executable programs. The predetermined application sequencing and the other processes and operations described herein are generally implemented in software as the executable programs of the controller 50. Of course, the controller 50 could be a microprocessor or the like accessing external memory of the computer in addition to or instead of on-board memory. The software and the controller 50 operating the software access a human interface computer 52 to obtain inputs, such as CAD coordinates. Of course, the system controller 50 could be part of the human interface computer 52 instead of being incorporated in a separate computer.

For the first predetermined application, at 32 the system is taught the location(s) of the coarse target(s) 26 and at 34 the system is taught the location(s) of the panel target(s) 28 for the particular region 24 of the panel 22 that is to be processed according to the instructions of the first application. Generally up to four coarse targets and four panel targets are used for a region 24. This teaching can occur through input of CAD coordinates by an operator of the human interface computer 52, for example, based on a query from the system controller 50.

After the system is taught the relevant coordinates for the locations of the coarse targets 26 and the locations of the panel targets 34 for the first application, a query is made for whether there are additional applications in the multi-application sequence at 36. If there are no additional applications, the training ends. If there are additional applications in response to the query at 36, training according to 32 and 34 is completed for the next applications until all applications in the multi-application sequence are trained. In the case of FIG. 2, the training ends when six applications (one each corresponding to each of the regions 24) have been taught the coordinates for their coarse and panel targets 26, 28.

Next processing of the multi-application sequence is described with reference to FIGS. 3 and 5. The panel 22 to be processed is transferred from a storage area to a vacuum support 58 using a load arm 54 of an autoloader 56. Of course, a vacuum support 58 is not necessary; the chuck 10 can be supported by clamps on a fixed surface. At 40 a multi-application sequence (an application list) is created and loaded to the system controller 50 from the human interface 52 computer. That is, a multi-application sequence is selected and trained according to FIG. 4, for example. Alternatively, the multi-application sequence previously developed and stored on the system controller 50 in the training process is loaded. Next, at 42 the coarse camera 60 is activated to locate the coarse targets 26 for the first application of the multi-application sequence. The low-resolution (coarse) camera 60 can have a resolution of 50 microns per pixel, for example. After the coarse camera 60 finds the coarse targets 26 for the first application (that is, the coarse targets 26 that identify the region 24 to be processed according to the first application), preprogrammed CAD coordinates that represent the expected placement of the panel 22 and region 24 are updated based on the alignment information of the coarse targets 26 received from the coarse camera 60 with respect to the trained coarse target coordinates.

Then, at 44 the panel targets 28 for the first application are located using the high resolution (fine) camera 62. The high resolution camera 62 can have, for example, a resolution of 2 microns per pixel. After the fine camera 62 finds the panel targets 28 for the first application (that is, the panel targets 28 that identify the region 24 to be processed according to the first application), preprogrammed CAD coordinates that represent the expected placement of the panel 22 and region 24 are updated based on the alignment information of the panel targets 28 received from the fine camera 62 with respect to the trained panel target coordinates.

After the CAD coordinates are updated based on the actual locations of the coarse and panel targets 26, 28 for a particular region 24, the first application is processed at 46. That is, all of the processing steps associated with the first application are processed in sequence in the region 24 associated with the first application. As shown by example in FIG. 3, this processing can include drilling using a laser beam emitted from a laser drill 64.

At 48, a query is made as to the existence of additional applications. In the present example, the response to the query at 48 would be "no" because five additional applications remain to be processed. Accordingly, processing returns to 42 to begin the process of locating the coarse and panel targets 26, 28 associated with the next region 24 according to the trained CAD coordinates so that the second application can be performed in proper alignment. If the system has reached the end of the list of applications, processing of the regions 24 (and the panel 22) ends. That is, 42, 44 and 46 end when the sequence of applications as reflected in the multi-application sequence (the application list) is indicated as complete at 48.

After the now-processed panel 22 is removed from the vacuum support 58 by an unloader arm 66 of the autoloader 56, the loader arm 54 mounts a fresh panel 68 on the vacuum support 58. At this time, a new multi-application sequence can be performed, or the same multi-application sequence performed on the processed panel 22 can be repeated.

As can be concluded from this description, this multi-application sequencing allows for the correction of positional error that results from processing the part. Therefore, if the panel shifted, stretched or was deformed while being processed because the panel is flexible, the ill-effects of such phenomena can be greatly reduced due to the refreshing of the alignment every time an application in a region, or portion, of the panel, is finished and the system switches to the next region. Similarly, this sequence of processing can be used in a situation where a plurality of smaller panels (each incorporating a number of patterns as shown in FIG. 1) is desired.

An example illustrates the problem and the solution shown herein. If a chuck plate 10 is sized to support a panel with dimensions of 20"×25", but the panels desired are only 5"×5," conventional processing described above requires replacement of the chuck plate 10 with a resized chuck plate having mounting dimensions for the smaller panel or the use of a jig to support the smaller panel sizes in the existing chuck plate 10.

According to the teachings herein, a single sheet can be used with dimensions of 20"×25" to fit into the existing chuck plate 10. On this single sheet, coarse and panel targets for each region sized to form the desired 5"×5" panel are made according to known methods prior to loading. Then, each region can be programmed with the same application that contains all of the patterns for the desired 5"×5" panel. Each region is processed in sequence with the same application based on the highly accurate alignment obtained according to the method taught herein. In post-production processing, the regions of the single sheet can be separated to form the desired 5"×5" panel through cutting by laser, saw, etc.

The teachings herein also can be used to perform processing for differently-sized panels that use the same substrate. For example, in the 20"×25" single sheet previously described, one application can be processed to form up to six panels where the desired panel dimensions for one application are 5"×10", and the desired panel dimensions for a second application are 15"×10". In such a case, for example, up to four regions for the first application can be defined in a 10"×20" area on the left side of the single sheet (like the panel 22). Then, up to two regions can be defined extending horizontally from right side of the four regions to the right side of the single sheet. Each of the regions is defined as described above with respect to its coarse targets 26 and panel targets 28. The multi-application sequence is programmed with a sequence of four applications for the first four regions and two applications for the final two regions, and processing of each of these applications is performed according to FIG. 5.

Under certain circumstances, one may wish to place multiple panels on the system and process them together assuming that they will physically fit on the chuck plate 10. For example, in the descriptions above, instead of processing a single sheet and then separating the sheet into separate panels, it may be desirable to place instead smaller panels 70 on the chuck plate 10 such as shown in FIG. 6. Problems, however, arise in current processing methods in that the panels are unlikely to be in exactly proper alignment so that the alignment process does not guarantee that the proper coordinates are used for each panel. For example, movement may occur between the panels 70 such as shown by the arrows 70, even if attempts are made to secure the separate plates 70 in place. That is, while conventional processing may result in a properly-aligned pattern in the first panel, as each panel is subsequently processed misalignments from panel to panel can cause misaligned patterns on those panels. Further, the inventors have concluded that, at times, it is undesirable to separately secure the plates 70 other than the normal methods to secure a single sheet (or part) on the chuck plate 10.

As shown in FIG. 6, two separate panels 70 are shown on the chuck 90, and the relationship one to the other changes from cycle to cycle. Training is thus similar to training described with reference to FIG. 4 except that, in addition to training the coarse and panel targets 26, 28 for each panel 70 associated with an application, the pattern targets 72 for each region of the panel 70 are also programmed. The novel sequencing allows these panels 70 to be processed simultaneously with highly accurate alignment for the processes performed according to the applications. Similar to the processing shown in FIG. 5, the locations of the coarse targets 26 are located with a low resolution camera, such as coarse camera 60, adjustment to the CAD coordinates occur based on these locations compared to the expected locations, the locations of the panel targets 28 are located with a high resolution camera, such as fine camera 62, and adjustment to the CAD coordinates occurs based on these locations compared to the expected locations. Additional processing steps occur to locate the pattern targets 72, if there, to locate the separate patterns that form an application for a particular panel 70. That is, the pattern targets 72 can be located by the high resolution camera, such as fine camera 62, and optionally additional adjustments can be made to the CAD coordinates. Once all of the pattern targets 72 are located, the system processes all of the programmed patterns, here two patterns, for an application simultaneously. That is, for the entire panel 70, every feature in every pattern belonging to the same processing step are processed together in the first application. Once the entire application has been processed, the second application (which is a repeat of the first application in FIG. 6) is run again for the second panel 70 by completing the steps of aligning to the coarse, panel and pattern targets 26, 28, 72 as described with respect to the first panel 70 of FIG. 6. After all panels 70 are processed as shown in step 36 of FIG. 4, an unprocessed part can be loaded. Of course, the same effects can be obtained without an autoloader with manual loading and unloading.

The novel sequencing method described would also allow the automation of the processing of multiple parts associated with different applications. For example, the novel sequencing method can be used with parts having different sizes mounted together, or a single part with several different applications oriented in various directions. For example, assume it is desirable to process one load in the chuck plate 10 to obtain four panels of application 1, followed by two panels of application 2 and followed by three panels of application 3, whether the chuck plate 10 is loaded with nine separate panels or if nine panels are to be created from one load on the chuck plate 10, such as from a single panel 22 as shown in FIG. 2. If the processing system is equipped with an autoloader that can automatically replace a processed part with a fresh one, after training this whole sequence one time, programming can be subsequently controlled by creating an application list such as:

```
/setup/multi-up-application-1
/setup/multi-up-application-1
/setup/multi-up-application-1
/setup/multi-up-application-1
/setup/multi-up-application-2
/setup/multi-up-application-2
/setup/multi-up-application-3
/setup/multi-up-application-3
/setup/multi-up-application-3
```

The system would then process this application list and create appropriate number of panels of each type using the load of the loaded chuck place 10 without any operator interaction.

Certain significant improvements can be realized with the multi-application sequencing described herein. Among these are that in the known modes of operation, the system collects alignment information (coarse, panel and pattern) only at the very beginning of an application. An implicit assumption is that the alignment mappings generated based on the initial state remains valid throughout the processing of the part. With the novel sequencing, alignment information is refreshed throughout processing for each pattern/panel just before that particular pattern is to be processed.

In addition, in current modes of operation the processing hierarchy dictates that for a given tool and tool step, every feature in every pattern that utilizes this "tool-step" combination is processed before processing to the next "tool-step" combination. With the novel sequencing, this processing hierarchy is reversed so that all the "tool-step" combinations for a particular pattern/panel are completed before the system proceeds to the next pattern/panel.

The novel sequencing is particularly advantageous in certain cases. For example, this method can allow the use of coarse-only alignment for each individual panel, instead of the coarse and fine alignment described. The equivalent approach is not possible if each panel were to be treated individually since current pattern alignment requires the use of a high resolution camera. Since the new method allows for the use of fresh alignment information while processing each panel, it can be especially useful in flex applications where the tension in the material is relieved as the processing (such as drilled holes) progresses. This relieving of tension can cause gradual degradation in alignment information integrity during processing, hence causing the feature placement accuracy to deteriorate.

The novel sequencing also provides additional benefits in factory automation when employed in systems equipped with autoloaders as described above.

While the invention has been described in connection with what is presently considered to be the most practical and preferred embodiments, it is to be understood that the invention is not to be limited to the disclosed embodiments but, on the contrary, is intended to cover various modifications and equivalent steps and arrangements included within the scope of the invention and any appended claims.

What is claimed is:

1. A method of performing a sequence of processing steps on a load supported by a processing plate, the method comprising:
  A) creating a sequential list of at least two applications to be performed in separate regions of the load, each of the at least two applications including respective processing steps;
  B) locating a coarse target of a first region of the load, the coarse target associated with a first application of the at least two applications;
  C) comparing predetermined coordinates for the coarse target of the first region with measured coordinates for the coarse target of the first region obtained from performing B);
  D) locating a panel target of the first region after performing C), the panel target of the first region associated with the first application;
  E) comparing predetermined coordinates for the panel target of the first region with measured coordinates for the panel target of the first region obtained from performing D);
  F) performing processing steps of the first application in the first region based on C) and E);
  G) locating a coarse target of a second region of the load after completing F), the coarse target of the second region associated with a second application of the at least two applications;
  H) comparing predetermined coordinates for the coarse target of the second region with measured coordinates for the coarse target of the second region obtained from performing G);
  I) locating a panel target of the second region after performing H), the panel target of the second region associated with the second application;
  J) comparing predetermined coordinates for the panel target of the second region with measured coordinates for the panel target of the second region obtained from performing I); and
  K) performing processing steps for the second application in the second region based on H) and J).

2. The method according to claim 1, further comprising: associating each of the at least two applications with respective predetermined coordinates for respective coarse targets and panel targets before performing A) through K).

3. The method according to claim 1, further comprising:
conducting a training process before performing A) through K), the training process including;
associating the predetermined coordinates for the coarse target of the first region with the first application;
associating the predetermined coordinates for the panel target of the first region with the first application;
associating the predetermined coordinates for the coarse target of the second region with the second application; and
associating the predetermined coordinates for the panel target of the second region with the second application.

4. The method according to claim 1 wherein the load comprises a single circuit board.

5. The method according to claim 1 wherein the load comprises at least at first circuit board and a second circuit board; and wherein the first circuit board is the first region and the second circuit board is the second region.

6. The method according to claim 1, further comprising: performing B), D), G) and I) using a low resolution camera.

7. The method according to claim 1, further comprising: performing B) and G) using a low resolution camera; and performing D) and I) using a high resolution camera.

8. The method according to claim 1 wherein the first region includes at least a first subregion and a second subregion, the first subregion defined by at least one pattern target and the second subregion defined by at least one pattern target, the method further comprising:
locating a first pattern target of the first subregion after performing E) and before performing F); and
locating a first pattern target of the second subregion after performing E) and before performing F); and wherein F) includes:
performing processing steps of the first application in the first region based on B) and E) and locating the first pattern target of the first subregion and locating the first pattern target of the second subregion.

9. The method according to claim 1, further comprising:
revising coordinates for the processing steps of the second application based on a result of H); and
revising the coordinates for the processing steps of the second application based on a result of J); and wherein K) includes:
performing the processing steps of the second application in the second region based on the revised coordinates for the processing steps of the second application.

10. The method according to claim 9, further comprising:
revising coordinates for the processing steps of the first application based on a result of C); and
revising the coordinates for the processing steps of the first application based on a result of E); and wherein F) includes:
performing the processing steps of the first application in the first region based on the revised coordinates for the processing steps of the first application.

11. An apparatus for performing a sequence of processing steps on a load supported by a processing plate, the apparatus comprising a controller programmed to perform the method according to claim 1.

12. The apparatus according to claim 11, further comprising:
a low resolution camera controlled by the controller to perform B), D), G) and I).

13. The apparatus according to claim 11, further comprising:
a low resolution camera controlled by the controller to perform B) and G); and
a high resolution camera controlled by the controller to perform D) and I).

14. The apparatus according to claim 11 wherein the load comprises a single circuit board.

15. The apparatus according to claim 11 wherein the load comprises at least at first circuit board and a second circuit board; and wherein the first circuit board is the first region and the second circuit board is the second region.

16. The apparatus according to claim 11 wherein the first region includes up to four coarse targets and up to four panel targets and the second region includes up to four coarse targets and up to four panel targets.

17. The apparatus according to claim 11, further comprising:
a laser drill controlled by the controller to perform F) and K).

18. In an apparatus for performing a sequence of processing steps on a load supported by a processing plate, the apparatus comprising a vacuum support, an autoloader including a loader arm for loading the processing plate on the vacuum support and an unloader arm for removing the processing plate from the vacuum support after the sequence is complete, the improvement comprising:
a controller programmed to:
A) create a sequential list of at least two applications to be performed in separate regions of the load, each of the at least two applications including respective processing steps;
B) locate a coarse target of a first region of the load, the coarse target associated with a first application of the at least two applications;
C) compare predetermined coordinates for the coarse target of the first region with measured coordinates for the coarse target of the first region obtained from performing B);
D) locate a panel target of the first region after performing C), the panel target of the first region associated with the first application;
E) compare predetermined coordinates for the panel target of the first region with measured coordinates for the panel target of the first region obtained from performing D);
F) perform processing steps of the first application in the first region based on C) and E);
G) locate a coarse target of a second region of the load after completing F), the coarse target of the second region associated with a second application of the at least two applications;
H) compare predetermined coordinates for the coarse target of the second region with measured coordinates for the coarse target of the second region obtained from performing G);
I) locate a panel target of the second region after performing H), the panel target of the second region associated with the second application;
J) compare predetermined coordinates for the panel target of the second region with measured coordinates for the panel target of the second region obtained from performing I); and
K) perform processing steps for the second application in the second region based on H) and J).

* * * * *